United States Patent [19]
Lia

[11] Patent Number: 5,262,590
[45] Date of Patent: Nov. 16, 1993

[54] IMPEDANCE CONTROLLED FLEXIBLE CIRCUITS WITH FOLD-OVER SHIELDS

[75] Inventor: Randell B. Lia, Lakeville, Minn.

[73] Assignee: Sheldahl, Inc., Northfield, Minn.

[21] Appl. No.: 874,713

[22] Filed: Apr. 27, 1992

[51] Int. Cl.⁵ .......................... H05K 1/00; H05K 3/00
[52] U.S. Cl. ........................................ 174/36; 156/55; 156/56; 174/117 FF; 174/268
[58] Field of Search .................. 174/36, 268, 117 F, 174/117 FF, 264; 439/65, 77, 497; 156/55, 56

[56] References Cited

U.S. PATENT DOCUMENTS

| | | |
|---|---|---|
| 2,703,854 | 3/1955 | Eisler .................................. 439/77 |
| 2,963,535 | 12/1960 | Wegener et al. .................... 174/254 |
| 3,132,203 | 5/1964 | Ecker ................................ 174/102 R |
| 3,462,542 | 8/1969 | Richter .............................. 439/497 |
| 3,876,964 | 4/1975 | Balaster et al. .................... 174/254 |
| 3,979,763 | 9/1976 | Mills ................................. 439/77 |
| 4,461,076 | 7/1984 | Plummer, III ..................... 439/497 |
| 4,902,236 | 2/1990 | Hasircoglu ......................... 439/77 |
| 4,913,662 | 4/1990 | Noy .............................. 174/117 FF |
| 5,134,252 | 7/1992 | Himeno et al. .................... 174/268 |

FOREIGN PATENT DOCUMENTS 2203905 10/1988 United Kingdom ................. 439/77

Primary Examiner—Morris H. Nimmo
Attorney, Agent, or Firm—Haugen & Nikolai

[57] ABSTRACT

An improved flexible circuit assembly arranged in stripline cable or microstrip configuration with shielding and also being designed with a predetermined characteristic impedance. The flexible printed circuits function as printed cables, and employ spacers on either side of the circuit traces so as to provide ground planes at a predetermined dimensional spacing from the traces comprising the circuit pattern. The arrangement of the present invention further comprises placing two or three individual conductor panels on a common substrate, so as to accommodate folding of the circuit panels, one over the other, to form a multi-layer sandwich. Elongated slots are formed along the fold lines so as to improve the integrity of the assembly, and to reduce buckling.

10 Claims, 4 Drawing Sheets

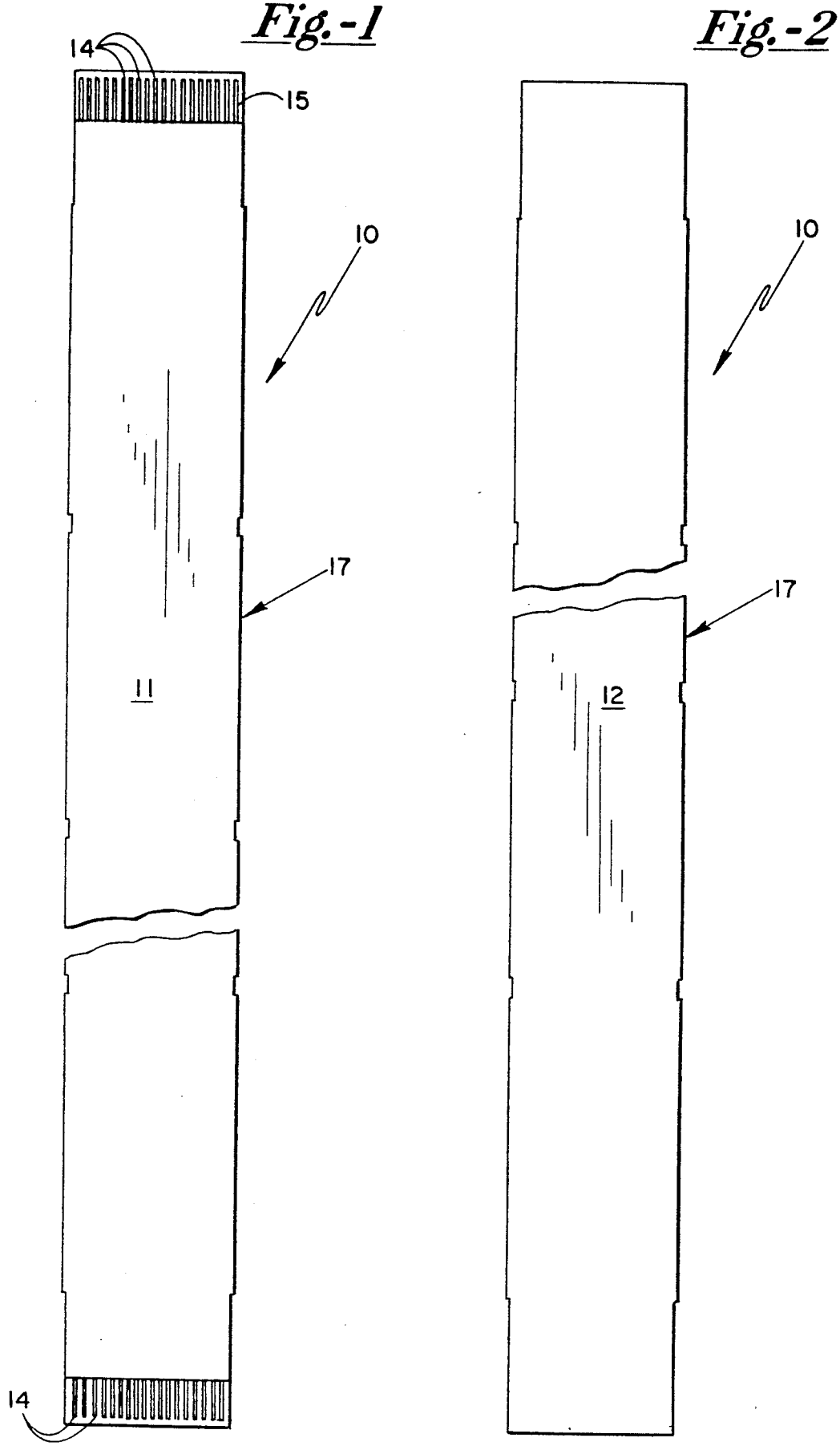

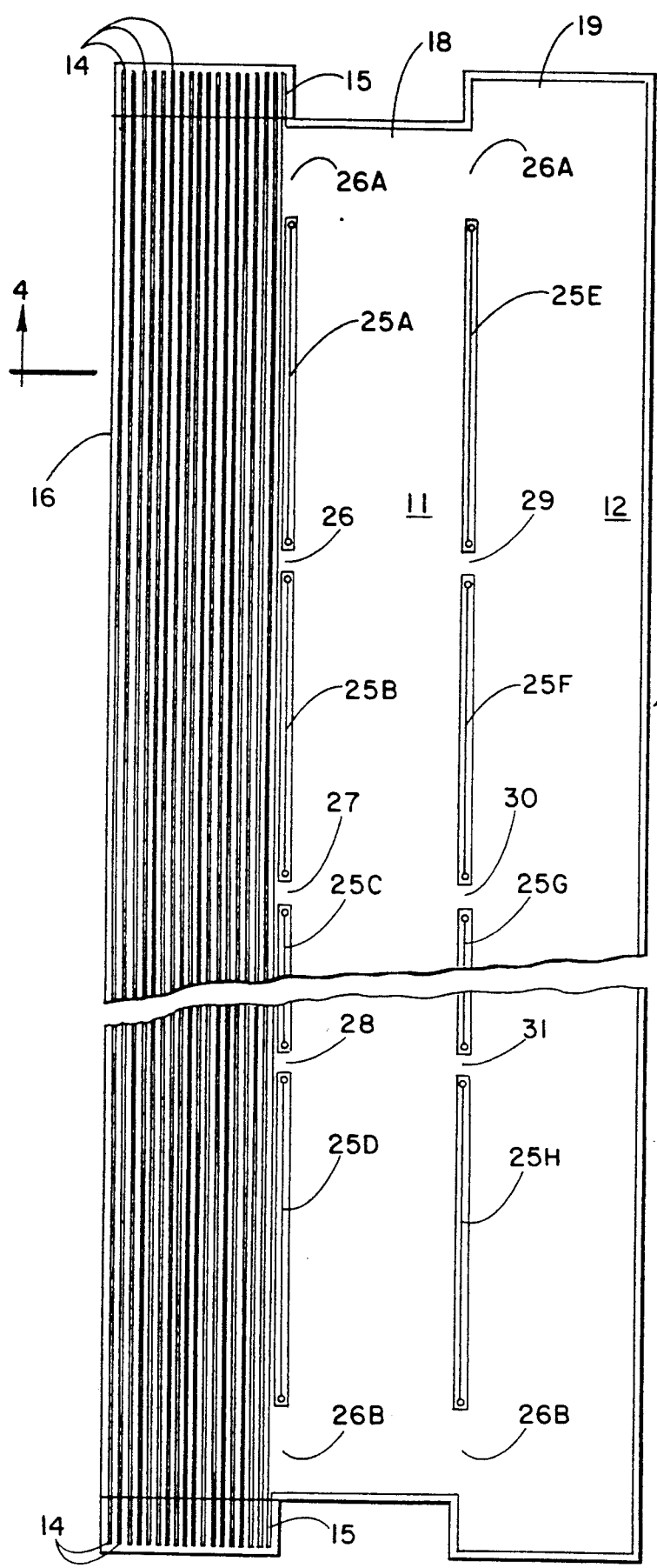
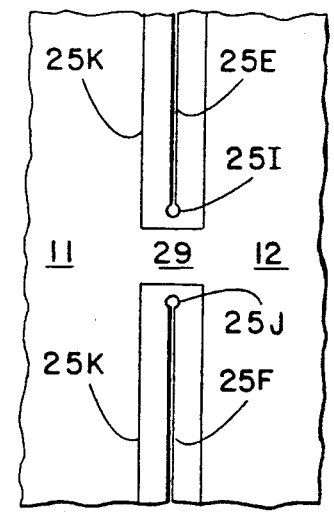
*Fig.-3*
*Fig.-3A*

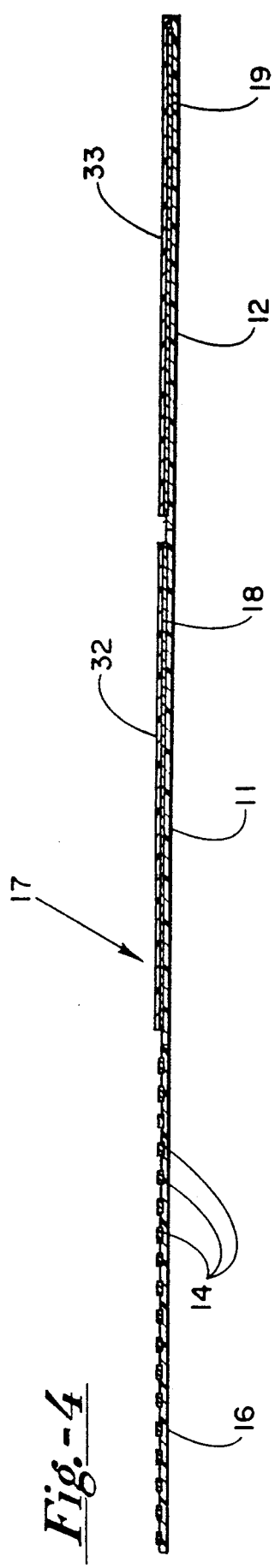
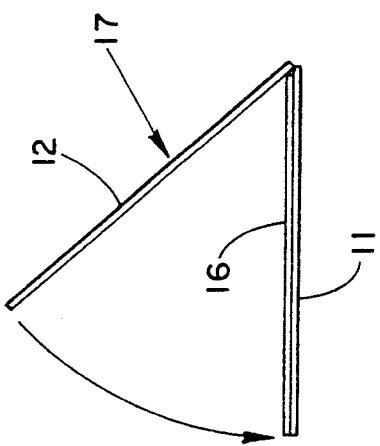
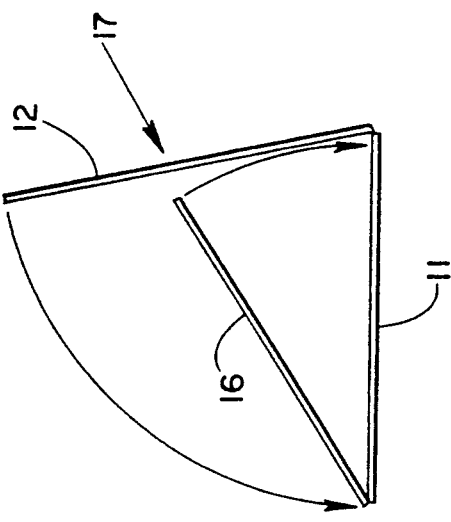

IMPEDANCE CONTROLLED FLEXIBLE CIRCUITS WITH FOLD-OVER SHIELDS

BACKGROUND OF THE INVENTION

The present invention relates generally to an improved flexible circuit assembly, and more particularly to an improved flexible circuit with signal traces arranged in stripline cable or microstrip configuration and provided with improved shielding and impedance characteristics. The flexible printed cable, stripline or microstrip devices of the present invention are fabricated in such a way that the finished product is designed or tailored to meet the characteristic impedance requirements of such devices when incorporated into products commonly found in the marketplace.

Flexible printed cables in stripline or microstrip configuration are widely used as interconnects for computer and telecommunication applications. Recently, these applications have required operational capability at higher and higher frequencies. For example, in order to take full advantage of recent advances and improvements in integrated circuit devices, improved packaging schemes are necessary. Current packaging techniques have become a recognized obstacle in being able to take full advantage of the improved capabilities and improved performance of electronic devices. While problems arising through the use of digital circuitry are sometimes different from those arising with analog circuitry, it is generally recognized that both designs are requiring operational capability at more rapid rates, with switching speeds in certain current designs entering the gigahertz range. In order to take full advantage of these technical advances in devices, a requirement arises for the utilization of short leads, shielding, ground planes, as well as certain other features. For example, stripline cable devices prepared in accordance with the present invention provide an integrated ground feature with performance capabilities approximating or equivalent to those of coaxial configuration. The features of the present invention provide a means of achieving reasonably full utilization of recent improvements in device technology, so that products employing modern devices can be expected to deliver high-speed performance while maintaining production costs compatible with those required in the current consumer electronics market. The improved flexible printed cable of the present invention has been found to meet current demands for both shielding and controlled impedance. Devices prepared in accordance with the present invention possess the advantage of having the signal layer disposed in and along the neutral axis, thereby making the product highly useful in applications requiring dynamic flexing. The features of the present invention employ standard single layer flex-circuitry processing technology to achieve or attain two or three layer products, but in addition, provide innovative treatment of the circuitry so as to accommodate novel folding and ultimate assembly so as to interconnect the ground plane and the signal layer. The features of the present invention provide for utilization of these advantages in a variety of circuitry configurations, with particular application to stripline or microstrip configurations.

In addition to the improved control of impedance and improvements in normal flexure performance, the products prepared in accordance with the present invention incorporate one or more slots and bridge arrangements so as to enhance the ability to resist or withstand delamination which may otherwise occur due to buckling of the outer layers following multiple flexure operations. In other words, product prepared in accordance with the present invention has been found to resist the tendency to buckle and form anomalies or zones of delamination as a result of being subject to multiple flexural excursions.

The performance advantages, including electrical as well as mechanical performance advantages are achieved without sacrificing economies of production. In other words, the advantages available in product produced in accordance with the present invention are achieved without undergoing significant increases in unit cost, with the features of the present invention providing a low cost alternative to normal production of three-layer flexible circuits. The printed cable and stripline products of the present invention are designed to be compatible with conventional connectors, including ZIF connectors. While the illustrations provided herein are shown in a ZIF configuration, it will be appreciated that the features of the present invention permit use with other conventional connectors as well. One particular advantage of the arrangement of the present invention is that it makes possible the utilization of a form of shielded cable which is compatible with and utilizes ZIF connectors.

SUMMARY OF THE INVENTION

Briefly and in accordance with the present invention, a flexible printed cable, such as a cable in stripline or microstrip configuration is formed upon a substantially integral or unitary flexible substrate, with the substrate being divided into at least two and preferably three discrete laterally spaced apart conductor-receiving panel zones. The first panel zone is provided with a conductor array defining an electrically conductive circuit pattern, such as the stripline configuration set forth above. The second and third panel zones are each provided with an electrically conductive layer arranged over substantially its entire area so as to define a ground plane for both surrounding and shielding the electrically conductive circuit pattern or traces as well as creating a predetermined characteristic impedance. The "predetermined characteristic impedance" is designed to meet the characteristic impedance requirements of the electronic system to which the device is ultimately connected. The circuit pattern includes at least one trace designed to function as a ground trace, with the ground trace or traces being in turn coupled to each of the ground planes. The second and third panel zones upon which the ground planes are formed are disposed laterally of the circuit panel and are separated from the circuit panel and/or each other by elongated slots. These elongated slots are formed upon the lateral edges of panel zones with each of the slots preferably having a plurality of spaced apart webs integral with the neighboring flexible substrate zone and forming bridges spanning the gap between such mutually adjacent panels. This arrangement permits the folding of the panels, one upon the other to create a multiple layer sandwich. In the final sandwich arrangement, the first panel zone, upon which the circuit traces (including ground traces) are disposed, is interposed and mounted in the median plane midway between the second and third panel (ground plane) zones. A spacer of predetermined thickness is applied to cover selected surfaces of the panels so as to be disposed between mutually abutting surfaces of the multiple layer sandwich. One or more layers of adhesive together with the substrate film cooperate and/or function in combination to form an insulative spacer between the conductive panel zones which are disposed outwardly of and generally enveloping the circuit traces. This combination of components, including the adhesive layers and the conductive panel supporting substrates collectively function as a "spacer means" and thereby provide or contribute to the additional function of creating a predetermined characteristic impedance in the finished product. In other words, in this arrangement, the thickness of the plastic film and adhesive layers and any other components comprising the "spacer means" are tailored and otherwise designed so as to provide a finished product meeting the characteristic impedance requirements of the intended application. In a stripline configuration, the characteristic impedance values typically range from between about 50 and 75 ohms, while in a microstrip configuration, the value may be in the range of between about 50 and 100 ohms. Characteristic impedance values are typically required and/or desired in these ranges, such as in stripline configurations for applications, including computer and telecommunication systems, as well as devices utilized in products found in the consumer electronics market.

Therefore, it is a primary object of the present invention to provide an improved flexible printed cable assembly preferably in stripline or microstrip configuration, which provides a shielded electrically conductive circuit pattern disposed in a neutral plane between a pair of outwardly disposed ground planes arranged in oppositely disposed relationship to the circuit pattern.

It is a further object of the present invention to provide an improved flexible printed circuit in stripline or microstrip configurations in which there is created a predetermined characteristic impedance.

It is yet a further object of the present invention to provide an improved flexible printed circuit in stripline or microstrip configurations which is designed to withstand multiple flexure without undergoing buckling of individual layers found in the laminate structure.

Other and further objects of the present invention will become apparent to those skilled in the art upon a study of the following specification, appended claims, and accompanying drawings.

IN THE DRAWINGS

FIG. 1 is a top plan view of a flexible printed cable in stripline configuration prepared in accordance with the present invention, and illustrating the device with ends having a configuration adapted for accommodating conventional connectors;

FIG. 2 is a bottom plan view of the flexible printed cable assembly illustrated in FIG. 1;

FIG. 3 is a top plan view of the work-in-process, prior to folding, of a stripline assembly prepared in accordance with the preferred embodiment of the present invention;

FIG. 3A is a fragmentary top plan view, on a slightly enlarged scale, showing the detail of adjacent ends of slots formed in the structure, and illustrating the treatment of the slot ends to avoid or reduce tearing;

FIG. 4 is a horizontal sectional view taken along the line and in the direction of the arrows 4—4 of FIG. 3;

FIG. 4A is a fragmentary sectional view of that portion illustrated in the right-hand end of FIG. 4, with FIG. 4A incorporating the details of the individual layers so as to illustrate the film and adhesive layers of the spacer means.

FIG. 5 is an end view of the partially completed device illustrated in FIG. 3, and illustrating the folding arrangement in progress, and prior to completion of the folding operation;

FIG. 6 is a view similar to FIG. 5, and illustrating the configuration of the product at a further point in the folding operation.

DESCRIPTION OF THE PREFERRED EMBODIMENT

Figure 7:
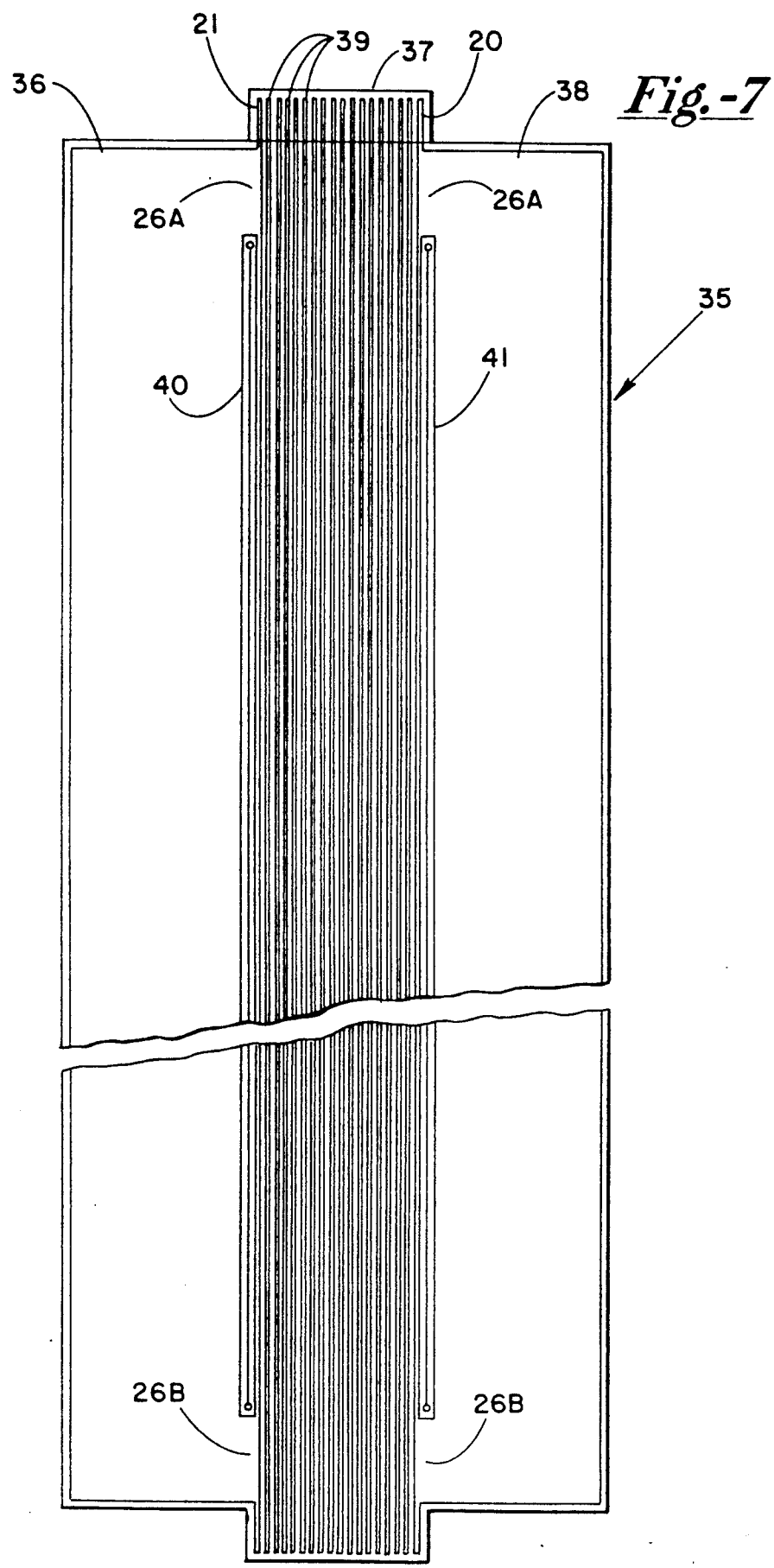
FIG. 7 is a view similar to FIG. 3, and illustrating an alternative embodiment of the work-in-progress, and wherein the stripline is arranged on a central panel, and with ground planes being disposed on panels arranged laterally thereof.

In accordance with the preferred embodiment of the present invention, and with particular attention being directed to FIGS. 1 and 2 of the drawings, the flexible printed cable means in stripline configuration is shown generally at 10, with the cable assembly including a flexible substrate such as the discrete conductor-bearing panel zones 11 and 12. Stripline 10 is provided with exposed conductor portions of elongated traces, such as conductors 14—14, along with a ground trace as at 15. As is apparent in a study of FIG. 3, the conductor traces 14—14 and ground trace 15 are disposed upon panel zone 16, with the conductor array defining an electrically conductive circuit pattern arranged on conductor-receiving panel zone 16. With continued attention being directed to FIGS. 1 and 2, and with attention being further directed to FIG. 3, it will be noted that conductor-bearing panels 11 and 12 are integral and/or unitary with flexible substrate shown generally at 17 and form ground planes therefor. In other words, flexible substrate 17 is comprised of three discrete laterally spaced apart conductor-receiving panel zones 11, 12, and 16. Flexible substrate 17, as is apparent in FIG. 3, may comprise a base portion and coverlay portion, which together form an encapsulating envelope for conductor traces 14—14 and ground trace 15. The same feature is present in those portions of substrate 17 in which the ground planes are mounted.

In certain configurations, the features of the present invention may be utilized in connection with assemblies in a stripline configuration. In such a configuration, however, and as is conventional in the art, the outermost circuit traces will comprise and be integral with the ground plane, thereby providing appropriate isolation. See, for example, the embodiment of FIG. 7.

With continued attention being directed to FIG. 3 of the drawings, it will be observed that conductor-bearing panel zones 11 and 12 are each provided with an electrically conductive layer such as layers 18 and 19 which are arranged over substantially the entire area of panels 11 and 12 respectively. Furthermore, layers 18 and 19 are integral, one with the other, and thereby achieve the desired feature of surrounding and shielding the electrically conductive pattern created by the conductor traces 14—14 and ground trace 15 which form the circuit pattern which is in stripline configuration. The ground trace 15 of the electrically conductive circuit pattern is electrically coupled to conductor panels 18 and 19 which, in the finished configuration, collectively define the ground plane for the conductors. In the configuration illustrated in FIG. 3, one such trace is provided, while in the alternate configuration of FIG. 7, two such traces are provided. See, for example, ground traces 20 and 21 respectively. The arrangement of FIG. 7 will be discussed more fully hereinafter.

With continued attention being directed to FIG. 3, panel zones 11, 12 and 16 are separated, one from the other, by elongated slots formed along mutually adjacent edges of adjacent panel zones, such as elongated slots formed collectively by slot members 25A, 25B, 25C, and 25D, along with a second series of such slot segments shown at 25E, 25F, 25G, and 25H. As is apparent in FIG. 3, these individual elongated slots are comprised of axially aligned segments, and are provided with a plurality of spaced-apart web zones integral with the substrate, such as web zones 26, 27, 28, 29, 30, and 31, along with major web zones at 26A—26A and 26B—26B. These web zones form bridges which span the gap between mutually adjacent panels, and thereby permit the folding of the panels, one upon the other, to form the multiple layer sandwich structure as illustrated in FIGS. 1 and 2. In the illustration provided in FIG. 3, it will be noted that there are five individual bridges provided for coupling each shield to the ground trace. In certain applications, the number of such bridges can be reduced to one, with as many additional bridges being provided as may be reasonably and realistically required. In the finished multiple layer sandwich as indicated hereinabove, the conductor carrying panel such as panel 16, is interposed and mounted between panels 11 and 12, with panels 11 and 12 carrying conductive layers 18 and 19 which form the ground plane about panel 16 and its stripline conductors.

As is apparent in the view of FIGS. 3 and 3A, individual slot segments 25A, 25B, 25C and 25D are arranged in axially aligned disposition. This is, of course, also true for slot segments 25E, 25F, 25G and 25H inclusive. With continued attention being directed to FIG. 3A, it will be observed that the tip ends of each of the slot segments is terminated in a circular or arcuate zone as shown, for example, at 25I and 25J. Additionally, it will be noted that the area covered by conductive metal, such as the panels 11 and 12, are terminated and/or delineated outside of the area and/or zones encompassed by slots 25E and 25F, as well as the circular terminating zones 25I and 25J respectively, with the edge of the conductive pattern being shown, for example, at 25K. Thus, conductive bridge zone 29 is indeed isolated and/or separated from the slotted areas by a distance sufficient to prevent exposure of any conductor directly to the outside surface.

Attention is now directed to FIG. 4 of the drawings wherein the layers of adhesive employed to form the sandwich are illustrated. In particular, panels 18 and 19 are covered on one surface with a layer of film with adhesive on both sides of the film, forming the spacer means as at 32 and 33. Spacer means 32 and 33 are of a predetermined thickness so as to achieve the appropriate spacing between the planes of conductor surfaces and the surfaces of the enveloping or surrounding ground planes. Thermosetting adhesives are normally preferred for this application, since such adhesive formulations may be formulated to maintain their flexural characteristics over extended cycles or episodes of flexure, and are also widely commercially available. Spacer means layer 33 is preferably of the same formulation thickness and composition as spacer means layer 32, in order to achieve matching flexural and electrical characteristics along the various components of the laminate structure forming the multiple layer sandwich. By employing spacer means layers of predetermined thickness, it is possible to create spacer means of a predetermined and desired thickness so as to provide a finished stripline product which meet the characteristic impedance requirements of the electronic systems commonly found in the marketplace. With attention being directed to FIG. 4A of the drawings, the substrate 17 carries a layer of adhesive 17A to support and bond copper conductive layer 19 thereon. The spacer means 33 comprises three individual layers collectively, with these layers including polyimide film 33A with a layer of adhesive applied to both surfaces thereof as at 33B and 33C. In order to better enable those skilled in the art to reproduce the product, the following specific examples are given:

EXAMPLE I

ZIF CONNECTOR or HEADER CONNECTOR COMPATIBILITY

In a single-sided flex-circuit folded in the manner illustrated in FIGS. 1-6 inclusive, the following circuit construction is undertaken:

| Layer | Material of Construction | Dimensional Thickness |
|---|---|---|
| Substrate | Polyimide available as "Kapton" from E. I. DuPont deNemours Corp. of Wilmington, Delaware | 2 mil |
| Spacer means | Composite of adhesive (1 mil), polyimide film (5 mil), acrylic-based adhesive film (1 mil) | — |
| Conductor | Copper | 1.4 mil (1 oz.). |

In a folded product construction, the following layers and their point of occurrence in the multiple layer sandwich are as follows:

| | | |
|---|---|---|
| 2 mil | Polyimide (Kapton) | |
| .6 mil | Base adhesive | |
| 1.4 mil | Copper | |
| 1 mil | Adhesive | |
| 5 mil | Polyimide | |
| 1 mil | Adhesive | |
| 2 mil | Polyimide | } spacer |
| .06 mil | Base adhesive | } means |
| 1.4 mil | Copper in circuit configuration | |
| 1 mil | Adhesive | |
| 5 mil | Polyimide | } spacer |
| 1 mil | Adhesive | } means |
| 1.4 mil | Copper | |
| 0.6 mil | Base adhesive | |
| 2 mil | Polyimide. | |

Impedance Calculations

In this arrangement, ground plane separation is equivalent to 20.6 mils. The electrical properties are as follows:
Dielectric constant = 3.5
Trace width = 0.005"
Copper thickness = 0.0014" (1 oz. copper).

For a single stripline, the impedance calculations are as set forth below:

| IMPEDANCE CALCULATION BASE | |
|---|---|
| Characteristic | |
| Distance between planes (inches) | 0.0206 |

-continued

IMPEDANCE CALCULATION BASE (determined by dimensions of
the spacer means components)
Width of trace may be as low as 0.0050 inches
Dielectric constant of material = 3.5000 (polyimide)
Copper thickness (.0014 in. per 1 oz.) = 0.0014
(conventionally utilized).

In the products produced in accordance with the features of the present invention, the spacer means is utilized, as indicated, as a combination of layers of adhesive being disposed on opposite surfaces of film. The spacer means provides a convenient parameter to achieve physical separation between ground traces and shields (ground planes) with the conductive traces being disposed along a plane which is medial to the shields. In order to achieve appropriate shielding, along with the requirements of characteristic impedance in the product, the spacer means provides a convenient parameter for achieving the desired results in the finished product.

While polyimide has been listed as the material of construction for the substrate, it will be noted that certain polyester materials or other dielectric substrates are suitable for this purpose as well. One particularly desirable polyester material is that certain polyester film fabricated as stress-oriented polyethyleneterephthalate, available commercially under the trade designation "Mylar" from E.I. DuPont deNemours Corp. of Wilmington, Del.

In a typical manufacturing process, the copper supporting substrate is selected as 2 mils polyimide. This composite substrate comprises the substrate panel 16 as illustrated in FIGS. 3 and 4. The circuit traces are prepared in conventional fashion, with the copper layer being cleaned, imaged with the appropriate resist, and etched. The residual resist is stripped following the etching operation, and spacer means tacked in place. The slots are then formed and the assembly blanked. Thereafter, the assembly is folded and laminated in a preselected fashion, such as a platen press. The conductors may be solder plated, as required, and the partially completed assembly inspected for continuity.

In the slot forming and blanking operation, the circuit blank is punched with the elongated slots, such as illustrated at 25A–25H inclusive, with the bridge areas remaining following the punching operation. Copper is removed from the edges of the bridges. The width of the elongated slots is such that upon folding, the length of the individual bridge zones forms a spine which is substantially equivalent in its length dimension to the thickness of the layers being enveloped.

While the product illustrated utilizes a ground plane which shields both sides of the entire circuit arrangement, the fabrication of structures with selective shielding zones is also possible. Furthermore, the examples given herein illustrate the product with a pair of shields surrounding the entire stripline. In certain instances, a product may be fabricated with only one shield such as in the form of a surface microstrip (embedded microstrip) configuration. In such an arrangement, a ground plane separation of 7.2 mil, for example, is achieved with the use of a bonding layer of 2 mil thickness, with a 10.2 mil separation being achieved with a 5 mil layer of adhesive.

In a microstrip configuration, the configuration of FIG. 3 would be simplified so as to eliminate or delete the panel indicated and designated number 19. In such an arrangement, the microstrip finds significant isolation with ground traces laterally of the circuit traces.

In the alternate embodiment illustrated in FIG. 7, substrate 35 comprises panel zones 36, 37 and 38. Panel zone 37 is centrally disposed relative to panel zones 36 and 38, and carries the conductor traces as shown therein, such as at 20 and 21 (ground traces) and at 39—39. This arrangement comprises a stripline configuration as indicated hereinabove in the embodiment of FIGS. 1-6. In this arrangement, however, elongated slots are formed in the area separating panel members 36, 37 and 38 one from another, such as illustrated at 40 and 41. In the embodiment of FIG. 7, the bridge zones are present where illustrated adjacent the opposed ends.

It will be understood, of course, that the specific examples provided herein are given for completeness of disclosure purposes, and are not to be construed as a limitation upon the scope to which the present invention is entitled.

What is claimed is:

1. In a flexible printed cable assembly including a substantially integral flexible substrate comprising at least two discrete laterally spaced apart conductor-bearing panel zones including a first panel zone having a conductor array defining electrically conductive traces defining a circuit pattern arranged thereon and at least two second panel zones, each second panel zone having an electrically conductive layer arranged over substantially the entire area of each of said second panel zones and each second panel zone defining a ground plane for surrounding and shielding said electrically conductive circuit pattern and to create a predetermined characteristic impedance in the electrically conductive traces forming said circuit pattern; the flexible printed cable assembly being characterized in that:
    (a) said electrically conductive circuit pattern of said first panel zone including at least one ground trace, and conductor means electrically coupling each of said ground planes to each of said at least one ground trace;
    (b) each of said electrically conductive layer receiving second panel zones being disposed laterally of said first panel zone and being separated from said first panel zone by elongated slots formed along mutually adjoining edges of adjacent panel zones, and with each of said slots comprising segments with a plurality of spaced apart webs integral with said flexible substrate and forming bridges spanning the gap between mutually adjacent panels and thereby permitting the folding of said panels, one upon the other, to form a multiple layer sandwich with said first conductor-bearing panel zone being interposed and mounted between said two second panel zones; and
    (c) spacer means comprising film and adhesive of predetermined thickness being applied to cover selected surfaces of said second panel zones so as to be disposed between mutually abutting surfaces of said multiple layer sandwich, the arrangement being such that the inner surfaces of the traces comprising said circuit pattern are spaced from the outer surfaces of each of said ground planes by a predetermined distance so as to create said predetermined impedance.

2. The flexible printed cable assembly as defined in claim 1 being particularly characterized in that said conductive circuit pattern comprises a plurality of parallelly spaced conductors, with at least one ground trace being disposed in parallel relationship to said conductors.

3. The flexible printed cable assembly as defined in claim 2 being particularly characterized in that said conductors include two ground traces arranged in the laterally out-most positions of said circuit pattern.

4. The flexible printed cable assembly as defined in claim 1 being particularly characterized in that adjacent pairs of said elongated slots are separated by a spaced-apart web integral with said panel zones.

5. The flexible printed cable assembly as defined in claim 1 being particularly characterized in that said flexible substrate is fabricated from a plastic dielectric film selected from the group consisting of polyimide and polyester.

6. The flexible printed cable assembly as defined in claim 1 being particularly characterized in that said spacer means consists of film with a layer of adhesive on both sides thereof.

7. The flexible printed cable assembly as defined in claim 1 being particularly characterized in that said electrical conductors consist essentially of copper.

8. The flexible printed cable assembly as defined in claim 4 being particularly characterized in that said ground planes are electrically coupled to said at least one ground trace through a conductor mounted upon at least one of said flexible substrate bridges.

9. The flexible printed cable assembly as defined in claim 4 being particularly characterized in that each of said elongated slots terminates in a radiused area to provide added tear resistance.

10. The method of forming a flexible printed cable in stripline form which comprises the steps of:
   (a) separating a substantially integral flexible substrate into at least three discrete laterally spaced apart conductor-bearing panel zones;
   (b) forming a conductor array defining an electrically conductive circuit pattern on one of said panel zones;
   (c) forming a ground plane over substantially the entire surface of said second and third panel zones;
   (d) applying a layer of insulative spacer means of predetermined thickness over selected surfaces of said second and third panel zones;
   (e) stamping said cable to form a plurality of axially aligned elongated slots along mutually adjoining edges of adjacent conductor-bearing panel zones, with said slots being discontinuous and defining spaced-apart webs integral with said flexible substrate and forming bridges spanning the gap between mutually adjacent panel zones; and
   (f) folding said panel zones, one upon the other, along said elongated slots so as to form a multiple layer sandwich with said spacer means layers interposed between said centrally disposed circuit pattern and each of said outwardly disposed ground plane supporting panel zones.

* * * * *